United States Patent
Gütle et al.

(10) Patent No.: US 12,399,340 B2
(45) Date of Patent: Aug. 26, 2025

(54) OPTICAL COMPONENT, OPTOELECTRONIC MODULE AND METHOD OF MANUFACTURE

(71) Applicant: Sensirion AG, Stäfa (CH)

(72) Inventors: Frank Gütle, Stäfa (CH); Lukas Rüthemann, Stäfa (CH); Marcel Mittelmueller, Stäfa (CH)

(73) Assignee: Sensirion AG, Stäfa (CH)

( * ) Notice: Subject to any disclaimer, the term of this patent is extended or adjusted under 35 U.S.C. 154(b) by 216 days.

(21) Appl. No.: 17/975,451

(22) Filed: Oct. 27, 2022

(65) Prior Publication Data

US 2024/0142728 A1    May 2, 2024

(51) Int. Cl.
*G02B 7/02* (2021.01)
*G02B 3/00* (2006.01)
(Continued)

(52) U.S. Cl.
CPC .............. *G02B 7/02* (2013.01); *G02B 6/4204* (2013.01); *H10H 29/855* (2025.01); *G02B 3/00* (2013.01); *G02B 3/0006* (2013.01); *G02B 3/0012* (2013.01)

(58) Field of Classification Search
CPC .............. H01L 31/0203; H01L 31/0232; H01L 31/02325; H01L 31/167; G02B 1/041;
(Continued)

(56) References Cited

U.S. PATENT DOCUMENTS 5,332,892 A    7/1994 Li et al.
5,963,336 A    10/1999 McAndrew et al.
(Continued)

FOREIGN PATENT DOCUMENTS

CN    106483051 A    3/2017
CN    106483051 B    7/2019
(Continued)

OTHER PUBLICATIONS

K. Takahashi et al., "A Silicon Micromachined f-theta Microlens Scanner Array by Double-Deck Device Design Technique," in IEEE Journal of Selected Topics in Quantum Electronics, vol. 13, No. 2, pp. 277-282, Mar./Apr. 2007, doi: 10.1109/JSTQE.2007.893099. (Year: 2007).*

(Continued)

*Primary Examiner* — Uyen Chau N Le
*Assistant Examiner* — Emma R. Oxford
(74) *Attorney, Agent, or Firm* — Davis Wright Tremaine LLP

(57) ABSTRACT

An optical component (11) can include a chip comprising a carrier substrate (13) made of a semiconductor material and a membrane (15) disposed on a planar membrane-carrying surface of the carrier substrate (13). The membrane (15) is formed integrally with the carrier substrate (13). A cavity (14) is formed in the carrier substrate (13), the cavity having a first end and a second end. The membrane (15) has a cavity-spanning portion that spans the cavity (14) at its first end. The cavity-spanning portion of the membrane (15) is transparent to light in a desired wavelength range. An optical element (16) for shaping, diffusing, or filtering the light is formed on or in the cavity-spanning portion of the membrane (15). The optical component (11) may be manufactured in a wafer-level process. Also disclosed is an optoelectronic module that includes the optical component (11) together with an optoelectronic device.

33 Claims, 8 Drawing Sheets

(51) Int. Cl.
*G02B 6/42* (2006.01)
*H10H 29/855* (2025.01)

(58) Field of Classification Search
CPC ...... G02B 3/00; G02B 3/0006; G02B 3/0012; G02B 6/32; G02B 6/42; G02B 6/4204; G02B 6/4244; G02B 6/425; G02B 6/4257; H10H 29/80; H10H 29/85; H10H 29/855
See application file for complete search history.

(56) References Cited

U.S. PATENT DOCUMENTS

| | | | | |
|---|---|---|---|---|
| 9,366,395 | B2* | 6/2016 | Petersen | F21K 9/60 |
| 10,475,937 | B1* | 11/2019 | Jones | H01L 31/173 |
| 11,513,050 | B2 | 11/2022 | Bergmann et al. | |
| 2002/0004204 | A1 | 1/2002 | O'Keefe | |
| 2006/0016995 | A1 | 1/2006 | Kummer et al. | |
| 2009/0130791 | A1* | 5/2009 | Kwon | H04N 23/57 |
| | | | | 438/64 |
| 2009/0289266 | A1 | 11/2009 | Lee et al. | |
| 2015/0153275 | A1 | 6/2015 | Park | |
| 2015/0325613 | A1 | 11/2015 | Rudmann et al. | |
| 2016/0025628 | A1 | 1/2016 | Kim et al. | |
| 2016/0056194 | A1* | 2/2016 | Rudmann | H10F 39/8053 |
| | | | | 257/432 |
| 2016/0072029 | A1* | 3/2016 | Geiger | H01L 33/483 |
| | | | | 257/98 |
| 2018/0097139 | A1 | 4/2018 | Li et al. | |
| 2018/0329065 | A1* | 11/2018 | Pacala | G01S 7/486 |
| 2018/0335347 | A1 | 11/2018 | Herrmann et al. | |
| 2019/0049355 | A1 | 2/2019 | Enenkel | |
| 2019/0346360 | A1 | 11/2019 | Jutte et al. | |
| 2020/0056981 | A1 | 2/2020 | Van Der Lee et al. | |
| 2020/0096310 | A1 | 3/2020 | Mutlu et al. | |
| 2020/0103334 | A1 | 4/2020 | Santangelo et al. | |
| 2020/0348544 | A1 | 11/2020 | Levy | |
| 2021/0199555 | A1 | 7/2021 | Bergmann et al. | |
| 2022/0165893 | A1 | 5/2022 | Hinds et al. | |
| 2024/0125979 | A1* | 4/2024 | Bourreau | G02B 5/20 |
| 2024/0176049 | A1* | 5/2024 | Iwahama | G02B 3/0031 |

FOREIGN PATENT DOCUMENTS

| | | |
|---|---|---|
| EP | 3225977 A1 | 10/2017 |
| EP | 3588057 A1 | 1/2020 |
| GB | 2448161 A | 10/2008 |
| WO | 2018100209 A2 | 6/2018 |
| WO | 2019115694 A1 | 6/2019 |
| WO | WO-2021213692 A1 * 10/2021 ......... G01N 15/0211 |

OTHER PUBLICATIONS

Dai et al., "Fabrication of Diffractive Optical Elements Using the CMOS Process", Institute of Physics Publishing, Journal of Micromechanics and Microengineering, Dec. 11, 2001, 7 pages.

ip.com, "Integrated Particulate Matter Sensor With Cavity", An IP.com Prior Art Database Technical Disclosure, May 14, 2020, 24 pages.

* cited by examiner

OPTICAL COMPONENT, OPTOELECTRONIC MODULE AND METHOD OF MANUFACTURE

TECHNICAL FIELD

The present technology relates to an optical component, to an optoelectronic module comprising an optical component, and to a method of manufacturing an optical component.

BACKGROUND

Optoelectronic modules can be used for illumination and/or sensing purposes. An optoelectronic module may comprise at least one optoelectronic device for emitting and/or detecting light and at least one optical element for manipulating the light that is emitted or detected by the optoelectronic device. For example, smartphones can comprise a lighting module and one or more camera modules. The lighting module may comprise a light source such as a light emitting diode (LED) and one or more optical elements for shaping the light that is emitted by the light source. The camera module may comprise an image sensor and one or more optical elements for focusing light that is received from a desired viewing direction towards the image sensor. Additional optoelectronic modules may be present for determining ambient lighting conditions, for implementing face recognition, for proximity sensing and for other purposes.

Optoelectronic modules can have technical challenges. For example, if too much light enters or leaves the module, the module may not illuminate to a desired level or not sense objects or particles with desired accuracy. Accordingly, there exists a need to improve optoelectronic modules.

SUMMARY

One challenge with optoelectronic modules is how to reduce light leakage from the light source into directions other than a desired range of directions of illumination and to prevent stray light from reaching the optoelectronic device from directions other than the desired viewing direction. In at least one embodiment, this challenge is observed for miniaturized optoelectronic modules, where miniaturized optoelectronic modules have, e.g., lateral dimensions below 6 mm, preferably less than 4 mm. As disclosed herein, systems, apparatuses, techniques, elements, and components disclosed herein can address at least this challenge for optoelectronic modules, including miniaturized optoelectronic modules.

In a first aspect, it is an object of the present technology to provide an optical component that can be effectively manufactured. It is another object to provide an optical component with a reduced thickness (e.g., small thickness). It is yet another object to provide an optical component for which the amount of stray light that can laterally enter or exit the optical component is reduced (e.g., minimal amount of light). An optical component may have lateral dimensions of less than 2 mm, preferably less than 1.5 mm (e.g., 1 mm or less).

These and other objects are achieved by an optical component comprising:
  a chip comprising a carrier substrate made of a semiconductor material and a membrane disposed on a planar membrane-carrying surface of the carrier substrate, the membrane formed integrally with the carrier substrate;
  a cavity formed in the carrier substrate, the cavity having a first end and a second end, the membrane having a cavity-spanning portion that spans the cavity at its first end, the cavity-spanning portion of the membrane being transparent to light in a wavelength range of interest, and
  at least one optical element formed on or in the cavity-spanning portion of the membrane, the at least one optical element configured to shape, diffuse, filter, and/or otherwise adjust the light,
  wherein the optical element is only a passive element.

By providing a membrane that is integrally formed with a semiconductor substrate to form a monolithic chip structure, the membrane can be made thin (e.g., very thin). In this manner the amount of stray light that can exit or enter the membrane laterally is minimized. The chip can be readily manufactured using wafer-level processes. Also, a passive element (or passive) can generally include material that is free of any active circuitry such as the carrier substrate is free of any complementary metal oxide semiconductor (CMOS) circuitry. In at least one embodiment, passive includes the carrier substrate being free of any CMOS circuitry. In at least one embodiment, a passive element includes where the carrier substrate is free of any CMOS. One advantage of the optical element being an only passive element can be that dimensions or size corresponding to that passive element (e.g., passive material) can be reduced compared to any CMOS circuitry. In at least one embodiment, the chip can be monolithic.

In contrast to a device from WO2021213692A1, the carrier surface is free of any CMOS circuitry, e.g., no CMOS circuitry is present on or in the carrier substrate. In this way, the optical component can be made compact and may be used in a wide range of applications as a passive component. Since CMOS circuitry is absent, wafer-level processes other than CMOS processes may be employed for manufacturing the optical component. For similar reasons, it is preferred that no photodetectors are formed on or in the carrier substrate. This does not exclude, however, that a separate optoelectronic device comprising a photodetector is placed inside the cavity to form an optoelectronic module.

The membrane may consist of a single layer of a transparent membrane material, or it may comprise two or more layers of identical or different membrane materials, at least one of these layers being made of a transparent material. In some embodiments, the at least one transparent membrane layer covers only part of the membrane-carrying surface of the carrier substrate such that the at least one transparent membrane layer laterally does not extend all the way to the perimeter of the membrane-carrying surface of the carrier substrate, leaving a strip, band, patch, or line on the membrane-carrying surface along the perimeter of the at least one transparent membrane layer that is free of any transparent membrane material. The strip preferably has a width of at least 100 micrometers. In this way, leakage of stray light into and out of the optical component is further reduced. The strip that is free of transparent membrane material and preferably extends without interruption along the entire perimeter of the at least one transparent membrane layer.

In some embodiments, the optical component comprises an opaque layer, e.g., a metal layer, that laterally covers a perimeter of the at least one transparent membrane layer to prevent light from entering or exiting the membrane at its perimeter.

In cases where the thickness of the membrane exceeds the wavelengths of the light that is transmitted through the membrane, it can be advantageous if the membrane, at least in a region that laterally surrounds the cavity-spanning portion, comprises a layer stack comprising a plurality of transparent membrane layers separated by metal layers, and if each of said transparent membrane layers has a thickness that is smaller than a wavelength of the light for which the respective transparent membrane layer is transparent. This avoids that the membrane acts as a lateral wave guide for the light.

The carrier substrate forms a lateral perimeter wall that laterally delimits the cavity. This lateral perimeter wall has a certain lateral width as measured in the plane in which the membrane extends. In some embodiments, the lateral width amounts to 1000 micrometers or less, preferably 500 micrometers or less anywhere along the perimeter of the carrier substrate. Greater widths may render the optical component bulky and/or expensive. On the other hand, it can advantageous if the lateral width is not too small. In embodiments, the lateral width is at least 100 micrometers, e.g., preferably at least 200 micrometers. Smaller widths may lead to mechanical stability issues and, depending on the material of the carrier substrate and the wavelength range to be transmitted by the optical element, to light leakage issues through the substrate.

The carrier substrate can be preferably made of a monocrystalline semiconductor material. In some embodiments, the carrier substrate is made of an elemental semiconductor material, in particular, a Group IV elemental semiconductor material like silicon. In some embodiments, the carrier substrate is made of a compound semiconductor material, in particular, a III-V compound semiconductor material like gallium antimonide (GaSb), indium antimonide (InSb), or indium arsenide (InAs). The semiconductor material may comprise impurities to increase attenuation of light in the semiconductor material. The semiconductor material preferably can have a linear attenuation coefficient of at least $10^2$ $cm^{-1}$ for the wavelength range of interest, more preferably at least $2 \cdot 10^2$ $cm^{-1}$. In some embodiments, the linear attenuation coefficient may be at least $3 \cdot 10^2$ $cm^{-1}$, at least $5 \cdot 10^2$ $cm^{-1}$ or even at least $10^3$ $cm^{-1}$. In other words, the semiconductor material may be somewhat transparent to the light on short distances of travel of the light, but only to a degree that causes most of the light to be attenuated over a distance that is in the typical range of the lateral width of the cavity. The wavelength range of interest may be a portion of the visible or near-infrared range of the electromagnetic spectrum, e.g., a portion of the wavelength range between about 400 nm and about 1100 nm.

The membrane may comprise at least one layer of a membrane material selected from silicon oxide, silicon nitride, crystalline silicon, and/or amorphous silicon. If the cavity-spanning portion of the membrane comprises more than one layer, it is preferred that the membrane materials have indices of refraction that increase along a direction of travel of light through the membrane.

In some embodiments, the chip is a silicon-on-insulator (SOI) chip comprising the carrier substrate made of silicon, an insulating layer on top of the carrier substrate and a silicon layer on top of the insulating layer. The cavity-spanning portion of the membrane may then comprise the silicon layer. In some embodiments, the cavity extends through the carrier substrate and the insulating layer all the way to the silicon layer, such that the cavity-spanning portion of the membrane comprises the silicon layer but not the insulating layer. In other embodiments, the cavity extends through the carrier substrate only up to the insulating layer such that the cavity-spanning portion of the membrane comprises both the silicon layer and the insulating layer.

In some embodiments, the at least one optical element comprises an external optical element that is disposed on a surface of the cavity-spanning portion of the membrane that faces away from the cavity and/or on a surface of the cavity-spanning portion of the membrane that faces towards the cavity. Instead, or in addition, the at least one optical element may comprise an internal optical element formed inside the cavity-spanning portion of the membrane, and/or a surface structure formed in one of the surfaces of the cavity-spanning portion of the membrane. In at least one embodiment, the optical element is only a passive element, e.g., is comprised of material and/or components that are not used in any activity circuitry or does not actively modify light.

In some embodiments, the optical element may comprise a focal element configured to concentrate light that impinges on the optical element, a diffusor configured to diffuse light that impinges on the optical element, a dielectric filter configured to selectively transmit or reject light in at least one predetermined wavelength range, and/or an opaque baffle having an opening that defines an aperture for the light that enters or exits the cavity through the cavity-spanning portion of the membrane. If the optical element comprises a focal element, the focal element may be a refractive optical element (ROE) or a diffractive optical element (DOE). In at least one embodiment, the optical element is only a passive element.

As already mentioned above, the membrane can be thin. Specifically, in some embodiments, the carrier substrate may have a carrier substrate thickness that is constant or has a maximum, the cavity-spanning portion of the membrane may have a thickness that is constant or has a maximum, and the constant or maximum thickness of the membrane is at most 10%, preferably at most 5%, even more preferably at most 2%, possibly even at most 1% of the constant or maximum thickness of the carrier substrate. In absolute numbers, the cavity-spanning portion of the membrane may have a thickness that is at most 20 micrometers, preferably at most 10 micrometers, more preferably at most 5 micrometers. In some embodiments, the thickness of the cavity-spanning portion of the membrane may be at most 3 micrometers or, in some cases, at most 2 micrometers or even at most 1 micrometer. The thickness of the cavity-spanning portion of the membrane can be more than two orders of magnitude lower than the typical thickness required for a transparent glass or plastic wafer.

In a second aspect, the present technology provides an optical assembly that comprises a stack of two or more optical components according to the first aspect of the present technology, wherein the cavities of these optical elements are mutually aligned along the height direction. In other words, the present technology provides an optical assembly comprising:
  a first optical component; and
  a second optical component,
    wherein each of the first and second optical components is in accordance with the first aspect, and
    wherein the first and second optical components are stacked in such a manner that the cavities of the first and second optical components are mutually aligned,
    wherein the first and second optical components include elements with passive properties only.

The optical elements of the first and second optical components may be identical or different. The carrier substrates of the optical components may have the same thickness or different thicknesses.

In a third aspect, the present technology provides an optoelectronic module comprising:
  a base substrate;
  an optoelectronic device for emitting or detecting light, the optoelectronic device being disposed on the base substrate; and
  the optical component of the first aspect,
  wherein the optoelectronic device faces the optical element of the optical component through the cavity.

In some embodiments, the optoelectronic device may be a light detector, in particular, an image detector or a camera.

In some embodiments, the optoelectronic module comprises a detector chip, the detector chip having a detector chip cavity and comprising a light detector that is integrated into an upper surface of the detector chip. The optical component, which is a component separate from the detector chip, may then be arranged on the upper surface of the detector chip in such a manner that the cavity of the optical component is aligned with the detector chip cavity along the height direction. The optoelectronic device may be a light source. The detector chip is then arranged relative to the light source in such a manner that light emitted from the light source is able to reach the optical element of the optical component through the detector chip cavity and the cavity of the optical component. Such a setup is particularly advantageous if the optoelectronic module is configured as a particulate matter sensor.

In a fourth aspect, the present technology provides a method of manufacturing an optical component comprising the steps of:
  providing a wafer comprising a carrier substrate made of a semiconductor material and a membrane, the carrier substrate having an planar membrane-carrying first surface and a planar second surface opposite the first surface, the membrane being disposed on the planar membrane-carrying first surface, the membrane being formed integrally with the carrier substrate,
  etching the carrier substrate from its second surface to create an array of cavities in the carrier substrate, each cavity having a first end and a second end, whereby a cavity-spanning portion of the membrane spans each cavity at its first end;
  creating an optical element on or in the cavity-spanning portion of the membrane, wherein the optical element is only passive; and
  dicing the wafer after the cavity and the optical element have been created to obtain the optical component.

The method may further comprise, before the step of dicing, a step of grinding the carrier substrate at its second surface to reduce a thickness of the carrier substrate.

In at least one embodiment, a method or process disclosed herein such as the above-mentioned method of manufacturing an optical component can be performed partially or completely by a processor that performs instructions, which when performed by the processor, cause machines or components to perform steps. In at least one embodiment, a process such as those processes described herein (or variations and/or combinations thereof) is performed under control of one or more computer systems configured with executable instructions and is implemented as code (e.g., executable instructions, one or more computer programs or one or more applications) executing collectively on one or more processors, by hardware or combinations thereof. In at least one embodiment, code is stored on a computer-readable storage medium, for example, in form of a computer program comprising a plurality of instructions executable by one or more processors. In at least one embodiment, a computer-readable storage medium is a non-transitory computer-readable storage medium that excludes transitory signals (e.g., a propagating transient electric or electromagnetic transmission) but includes non-transitory data storage circuitry (e.g., buffers, cache, and queues) within transceivers of transitory signals. In at least one embodiment, code (e.g., executable code or source code) is stored on a set of one or more non-transitory computer-readable storage media having stored thereon executable instructions (or other memory to store executable instructions) that, when executed (e.g., as a result of being executed) by one or more processors of a computer system, cause computer system to perform operations described herein. A set of non-transitory computer-readable storage media, in at least one embodiment, comprises multiple non-transitory computer-readable storage media and one or more of individual non-transitory storage media of multiple non-transitory computer-readable storage media lack all of code while multiple non-transitory computer-readable storage media collectively store all of code. In at least one embodiment, executable instructions are executed such that different instructions are executed by different processors—for example, a non-transitory computer-readable storage medium store instructions and a main central processing unit ("CPU") executes some of instructions while another CPU executes other instructions. In at least one embodiment, different components of a computer system have separate processors and different processors execute different subsets of instructions.

In some embodiments, the method further comprises, before the step of dicing, a step of removing part of the membrane laterally outside the cavity-spanning portion such that the membrane covers only part of the upper surface of the carrier substrate.

The method may comprise, before the step of dicing, a step of bonding the carrier substrate to a base substrate that carries a plurality of optoelectronic components, such that at least one of the optoelectronic components is received in each cavity of the carrier substrate.

The wafer may comprise an etch-stop layer between the carrier substrate and the membrane. After the step of etching the substrate, the etch stop layer inside each cavity may then be selectively etched away to expose the cavity-spanning portion of the membrane.

The wafer may be a silicon-on-insulator wafer comprising a carrier substrate made of silicon, an insulating layer on top of the carrier substrate, and a silicon layer on top of the insulating layer. The method may comprise, after the step of etching the carrier substrate, a step of selectively etching the insulating layer inside each cavity away to expose the cavity-spanning portion of the membrane.

In at least one embodiment, the present technology can have advantage or benefit over known techniques. For example, US2015325613A1 discloses an optoelectronic module that includes a substrate, an optoelectronic device that is disposed on the substrate, a transparent cover, an optical element that is disposed on a surface of the transparent cover, and a non-transparent spacer that is arranged between the substrate and the transparent cover. To reduce the amount of stray light that enters or exits the optoelectronic module through the side walls of the transparent cover, the exterior sidewalls of the transparent cover are covered with a non-transparent material. For manufacturing the optical module, a transparent wafer is provided. The wafer is composed of glass or of a transparent plastics material. An array of optical elements are formed on a surface of the transparent wafer by a replication technique. Subsequently, in some embodiments, a spacer wafer is attached to the transparent wafer to form spacers around the optical elements. The spacer wafer is composed of a non-transparent material, such as epoxy with carbon black. In some embodiments, the resulting wafer stack ("spacer/optics structure") is subsequently attached to a base substrate with an array of optoelectronic devices thereon. Trenches are then formed in the transparent wafer, and the trenches are filled with a non-transparent material. The wafer stack and the base substrate are subsequently separated into individual optoelectronic modules. As a result of this process, the exterior sidewalls of the transparent cover of each optoelectronic module are covered with the non-transparent material that was filled into the trenches. While this process can be comparatively efficient in being a wafer-level process, thus enabling creation of a large number of optoelectronic modules simultaneously, the process is disadvantageous in several respects. First and foremost, the process requires two separate wafers: a transparent wafer from which the transparent cover with the optical element is formed, and a separate opaque spacer wafer. As each of these wafers has a certain minimum required thickness, the resulting optoelectronic module may have an undesirably large thickness. Second, the process requires the cutting of trenches onto the wafers ("pre-dicing") and the filling of the non-transparent material into the trenches. Both of these processes are not standard wafer-level processes and are highly non-trivial. This renders manufacture of the optoelectronic modules not only complex, but also expensive. Accordingly, the present technology can be an improvement on known techniques because it improves the manufacturing process as disclosed herein.

BRIEF DESCRIPTION OF THE DRAWINGS

Embodiments of the present technology are described in the following with reference to the drawings, which are for the purpose of illustrating the present technology and not for the purpose of limiting it. In the drawings.

DETAILED DESCRIPTION

Figure 1:
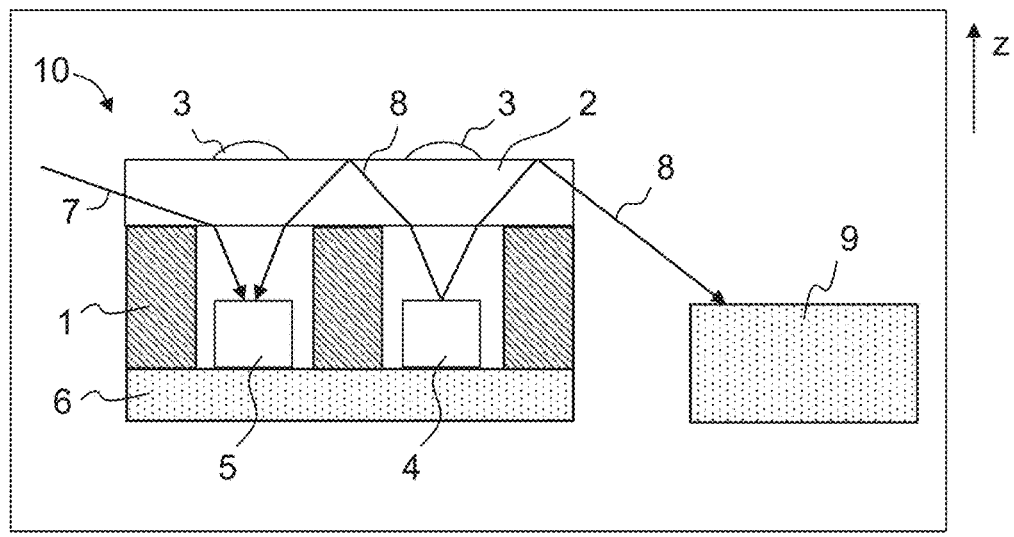
FIG. 1 illustrates, in a highly schematic view, a device including an optoelectronic module.

Throughout the present specification and claims, the terms "in particular", "preferably," and "optionally" are to be understood to express that the corresponding subject-matter is optional. The expression "comprising a or b" is to be understood as including the situations "comprising only a," "comprising only b," and "comprising both a and b." In other words, this expression is to be understood to be synonymous with the expression "comprising at least one of a and b."

Directions can be as follows: the carrier substrate has a membrane-carrying surface, on which the membrane is disposed. This surface is designated as the "upper" or "top" surface. The surface of the carrier substrate that is located opposite to the membrane-carrying surface is designated as the "lower" or "bottom" surface. The cavity in the carrier substrate has two ends. These ends are designated as the "upper" and "lower" ends. The "upper" end is the end that is adjacent to the membrane, while the "lower" end is the end that is located away from the membrane. The membrane has an "upper" surface that faces away from the cavity and a "lower" surface that faces towards the cavity. The membrane extends parallel to the membrane-carrying surface, thereby defining a membrane plane. The direction perpendicular to the membrane plane is designated the "vertical" or "height" direction. In some embodiments, the optical element defines an optical axis that extends along the height direction. A "lateral" direction is any direction that is perpendicular to the height direction, e.g., any direction that is parallel to the membrane plane. These definitions are not intended to define absolute directions in space; they only serve to define relative orientations and locations within the device. In at least one embodiment, because the optical element is only a passive element, it has a reduced lateral dimension such that the optoelectronic module can be reduced in size.

A material is called "transparent" to light in a wavelength range of interest if the linear attenuation coefficient of the material for the light in the wavelength range is less than $10^3$ cm$^{-1}$, preferably less than $3 \cdot 10^2$ cm$^{-1}$. In other words, a material is called "transparent" if the light is attenuated by not more than approximately 10%, preferably not more than 3% during its passage through 1 μm of the material. Some transparent materials, such as silicon oxide and silicon nitride, may have much lower attenuation coefficients, e.g., less than 10 cm$^{-1}$ or even less than 1 cm$^{-1}$, throughout the visible and near-infrared ranges. A membrane or membrane layer is designated as being "transparent" for light in a wavelength range of interest if attenuation of the light during the passage of the light through the membrane or membrane layer along the height direction is less than 10%, preferably less than 5%, more preferably less than 2%, even more preferably less than 1%.

The term "silicon oxide" is to be understood to include silicon dioxide.

An optical element is considered a focal element if the optical element is capable of reducing the divergence of a bundle of light rays that impinges onto the optical element, for instance, by shaping a divergent bundle of rays into a collimated beam or into a convergent bundle of rays. A focal element does not necessarily need to define a single focal spot. In at least one embodiment, the optical element is only a passive element in that it is capable of reducing the divergence of light rays based on the inherent or intrinsic properties of its material, wherein reduction of divergence of light rays is not based on active circuitry.

Light Leakage and Stray Light

FIG. 1 illustrates, in a highly schematic manner, a device (e.g., a smartphone) that includes an optoelectronic module 10. The optoelectronic module 10 comprises a base substrate 6, on which two optoelectronic devices 4, 5 are disposed: a light source 4 and a light detector 5. Also disposed on the base substrate 6 is a spacer element 1. The spacer element 1 has two cavities in the form of through-holes through the spacer element 1, each through-hole extending along a height direction z. One of the cavities houses the light source 4, the other cavity houses the light detector 5. The spacer element 1 is made of a material that is non-transparent (opaque) to the light emitted by the light source 4. In this manner, direct transmission of light from the light source 4 to the light detector 5 through the spacer element 1 is prevented. A transparent cover 2 is disposed on top of the spacer element 1. Optical elements 3 in the form of lenses are disposed on top of the transparent cover 2. The optical elements 3 serve for shaping the light that is emitted from the light source 4 and for shaping the light that is received by the optical elements from outside the optoelectronic module 10. The spacer element 1, the transparent cover 2 and the optical elements 3 together form a spacer/optics structure. The spacer/optics structure may be manufactured separately from the base substrate 6 and the optoelectronic devices 4, 5 and may be mounted to the base substrate 6 as a pre-assembled unit.

In the setup of the optoelectronic module 10 in FIG. 1, external stray light 7 may enter the transparent cover through the side walls of the transparent cover 2 and may reach the light detector 5. In addition, internal stray light 8 from the light source 4 may laterally travel through the transparent cover 2 and reach the light detector 5 or leak through the side walls of the transparent cover 2 to the outside of the optoelectronic module 10, where it may interfere with other light-sensitive components (symbolized by a light-sensitive component 9) in the device.

The present technology provides an optical component that can be produced more easily and more efficiently than in other prior art structures. The resulting optical component can be produced with much reduced thickness as compared to the prior art. In addition, the optical component of the present technology reduces or avoids the entry of stray light into an optoelectronic module or the leakage of light from the optoelectronic module.

Monolithic Optical Spacer Wafer

Figure 2A:
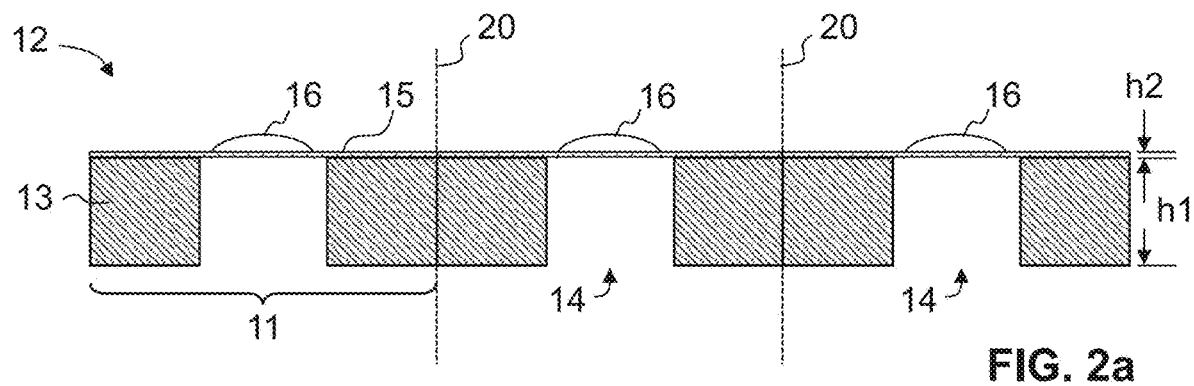
FIGS. 2a and 2b illustrate a processed wafer comprising an array of optical components according to an embodiment.

FIG. 2a illustrates a wafer 12 from which a plurality of optical components 11 according to the present technology may be obtained by dicing the wafer 12 along cutting planes 20. The wafer 12 may be called a "monolithic optical spacer wafer", as it integrates a spacer function with an optics function in one single, monolithic wafer structure. The wafer 12 comprises a carrier substrate 13 on which a membrane 15 is disposed. An array of cavities 14 has been etched into the carrier substrate 13 to expose a cavity-spanning portion of the membrane 15 at each cavity 14, the cavity-spanning portion spanning the upper end of the respective cavity 14. The cavity-spanning portion carries an optical element 16.

The carrier substrate 13 is composed of a semiconductor material. In particular, the carrier substrate 13 may be composed of silicon or of a compound semiconductor. The carrier substrate typically has a thickness h1 along the height direction z between 200 μm and 500 μm.

The membrane 15 may be formed by a single membrane layer or by a layer stack. The membrane 15 can have a thickness h2. Each layer of the membrane may be composed of one of the following materials: silicon oxide, silicon nitride, crystalline silicon, or amorphous silicon. The membrane may also comprise one or more structured metal layers. At least the cavity-spanning portion of the membrane 15 is transparent to light in a desired wavelength range. The cavity-spanning portion of the membrane 15 may have a thickness of less than 1 or 2 μm.

Etching of the cavities 14 may be achieved by any suitable etching method, including but not limited to deep reactive ion etching (DRIE) or potassium hydroxide (KOH) etching. The membrane 15 may act as an etch stop during etching.

The optical element 16 may be created by any suitable wafer-level method, including but not limited to wafer-level polymer imprinting, nano imprint lithography, greyscale lithography, electron beam lithography, sputtering, or plasma-enhanced chemical vapor deposition (PECVD). In at least one embodiment, optical element 16 is a passive element only (e.g., does not include any CMOS circuitry or any circuitry or material that actively or dynamically adjusts light).

The membrane 15 forms a transparent cover of the cavities 14. Since the membrane 15 is very thin, its height typically being typically well below 10% and in some cases less than 1% of the height of the carrier substrate 13, the amount of stray light that can leak from the membrane 15 or enter the membrane 15 laterally through its side walls is much smaller than with the transparent cover 2 in the embodiment of FIG. 1.

Figure 2B:
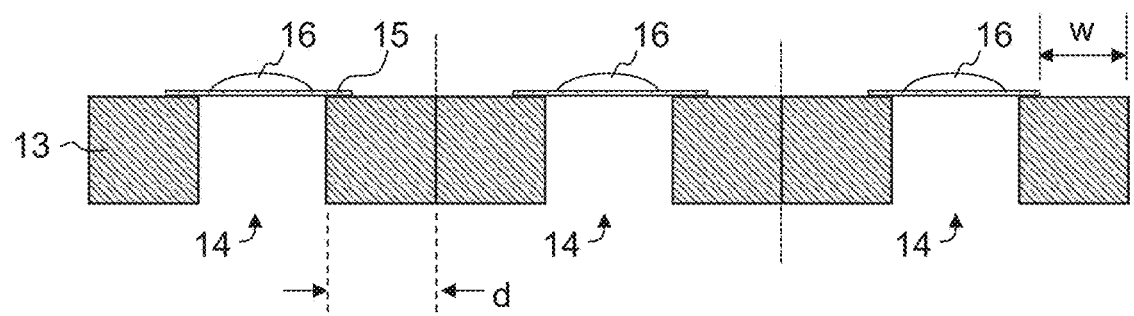

To further reduce the effects of stray light, parts of the membrane 15 outside the cavity-spanning portion (or at least the transparent layer(s) of the membrane in case of a multi-layer membrane) may be etched away in an additional wafer-level etching step, e.g., before dicing, such that the remaining portion of the membrane 15 or of its transparent layer(s) covers only part of the upper surface of the carrier substrate 13. This is illustrated in FIG. 2b. As a result, the membrane 15 or at least its transparent layer(s) laterally do not extend all the way to the perimeter of the upper surface of the carrier substrate 13 of the optical component 11 after the wafer has been diced, leaving a strip between the perimeter of the membrane portion that remains on the carrier substrate 13 and the perimeter of the upper surface of the carrier substrate 13 that is free of transparent membrane material. The strip preferably extends without interruption along the perimeter of the remaining membrane portion and preferably has a width w of at least 100 μm.

Method of Manufacture: First Example

Figure 3A:
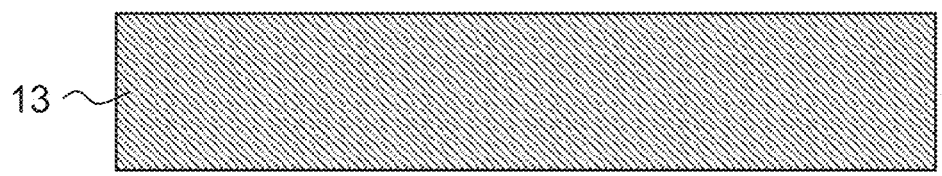
FIGS. 3a to 3f illustrate a method of manufacturing a plurality of optical components according to an embodiment.
Figure 3B:
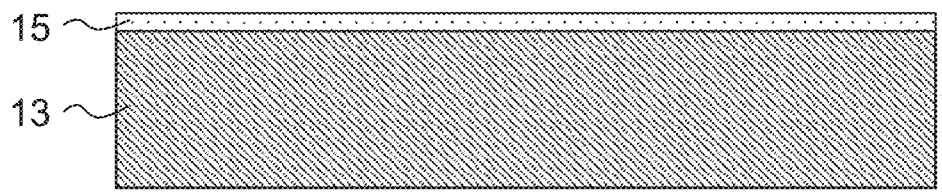
Figure 3C:
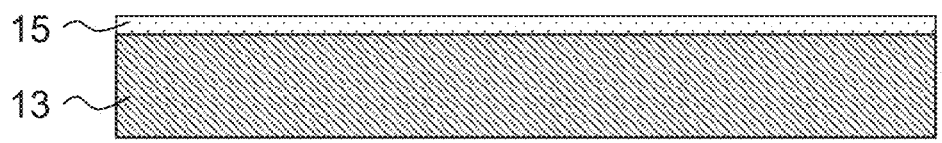
Figure 3D:
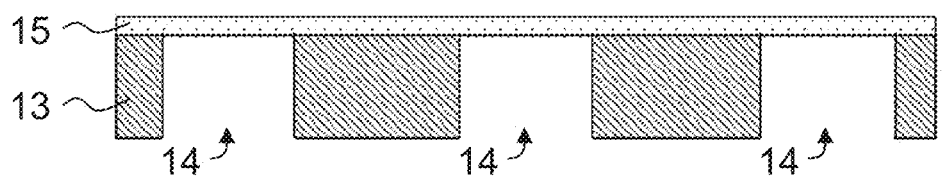
Figure 3E:
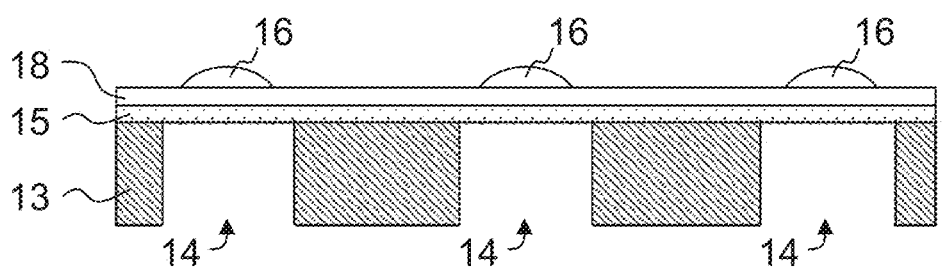
Figure 3F:
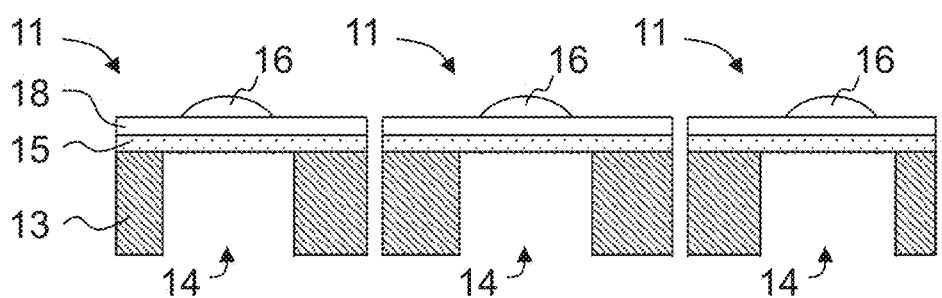

FIGS. 3a-3f illustrate an exemplary method of manufacture of a plurality of optical components according to an embodiment of the present technology. Initially, the carrier substrate 13 of the wafer is provided (FIG. 3a). The carrier substrate 13 may, for instance, be a silicon wafer. The thickness of the carrier substrate may be, e.g., in the range of 250 μm to 1000 μm. For instance, a typical thickness for a silicon wafer is 725 μm. In a next step, the membrane 15 is deposited onto the carrier substrate 13 (FIG. 3b). While only one single layer is illustrated in FIG. 3b, the membrane 15 may have more than one layer. Each layer may be composed, e.g., of silicon oxide, silicon nitride or a metal. Deposition of the membrane layers may be done by any suitable wafer-level process, such as chemical vapor deposition (CVD). One or more of the layers may be structured before the next layer is deposited. In particular, if any metal layers are present, these metal layers may be partially removed. Structuring of the layers may be done by any suitable wafer-level process, e.g., by a lithographic process. Optionally, the carrier substrate 13 is subsequently ground at its bottom surface to reduce the thickness of the carrier substrate 13 (FIG. 3c). The carrier substrate 13 is then etched from its bottom surface to create an array of cavities 14 in the carrier substrate 13 (FIG. 3d). If the carrier substrate is a silicon wafer, etching may be done, e.g., by deep reactive ion etching (DRIE). Each of the resulting cavities 14 extends from an open lower end all the way to the membrane 15, exposing a cavity-spanning portion of the membrane 15 at the upper end of the cavity 14. As a result, the upper end of the cavity 14 is spanned by the cavity-spanning portion of the membrane 15. An array of optical elements 16 is then formed on the membrane 15, such that an optical element 16 is disposed on each of the cavity-spanning portions of the membrane 15 (FIG. 3e). In the present example, the optical elements 16 are refractive optical elements (ROEs). The optical elements 16 may be formed by a polymer imprinting (e.g., embossing) process. To this end, a polymer is dispensed centrally on the membrane, and an imprint stamp (embossing die) is pushed towards the carrier substrate to shape the optical elements. Typically, a thin flat polymer base layer 18 that covers the entirety of the carrier substrate 13 is formed in this process as well. The base layer 18 is typically less than 100 µm thick, preferably less than 50 µm. The resulting "monolithic optical spacer wafer" with the optical elements thereon is then diced to obtain a plurality of singulated optical components 11 (FIG. 3O). Before dicing, the "monolithic optical spacer wafer" may be bonded to a base substrate (e.g., a base wafer, a land grid array, or a printed circuit board) with optoelectronic devices on it, and the resulting composite structure may be diced afterwards. In at least one embodiment, optical elements 16 are passive only, e.g., include a polymer that has inherent or intrinsic properties that modify light or allow light to pass through with minimum (e.g., reduced) modification. In at least one embodiment, optical elements 16 are designed with passive properties to modify, filter, or adjust light to bend or diffuse in a particular way but only based on passive properties of material of the optical elements 16. In at least one embodiment, passive can mean does not require or use any power or input of energy to modify or adjust light.

FIGS. 3a to 3f are not to scale. Specifically, the thickness of the membrane 15 in relation to the thickness of the carrier substrate 13 is depicted thicker than it would typically be in reality. The thickness of the membrane is typically well below 10% of the thickness of the carrier substrate 13. The lateral dimensions of the resulting optical components 11 are typically larger than their thickness by at least a factor of 2. Typical lateral dimensions of the optical component 11 are 800 µm to 2000 µm. Typical lateral dimensions of the cavity are 300 µm to 800 µm.

The steps of the presently proposed method of manufacture do not necessarily have to be carried out in the above-described order. For instance, the step of grinding the carrier substrate may be left away or may be carried out after the cavities have been formed or even after the optical elements have been created. As another example, the optical elements may already be created before the cavities are etched. This may be advantageous in cases where the cavity-spanning portion of the membrane has insufficient stability to allow an imprinting operation to be carried out after creation of the cavities. If the grinding and/or etching is carried out only after creation of the optical element, a custom-made chuck may be employed for covering the upper surface of the wafer during these operations, the chuck having depressions for receiving the optical elements without damage. In particular, such a chuck allows turning the wafer upside down for the grinding operation without damaging the optical elements.

Method of Manufacture: Second Example

Figure 4A:
FIGS. 4a to 4f illustrate a method of manufacturing a plurality of optical components according to an embodiment.
Figure 4B:
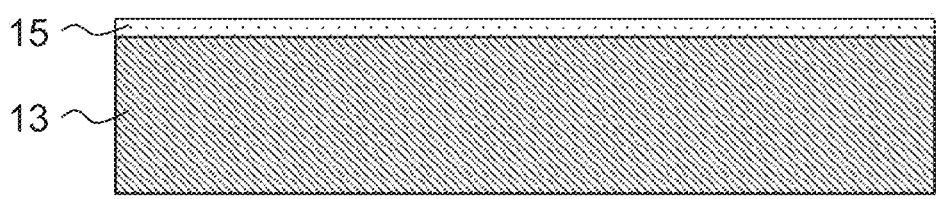
Figure 4C:
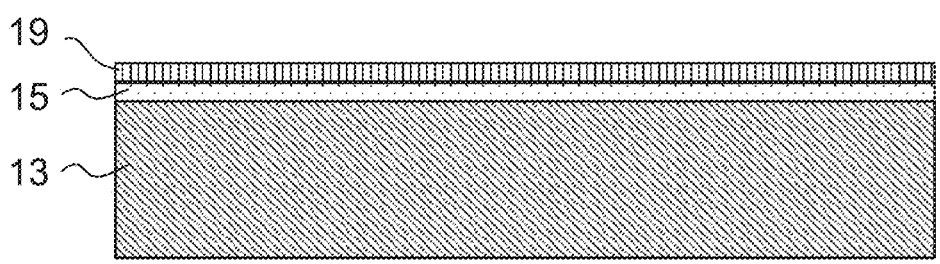
Figure 4D:
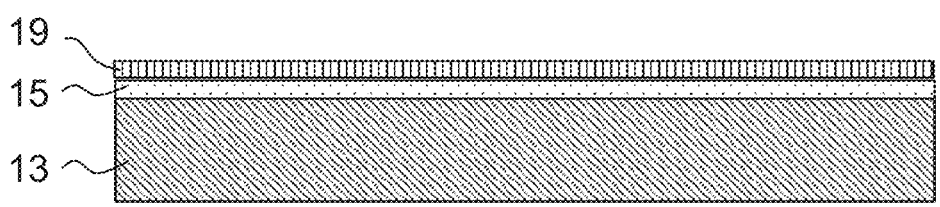
Figure 4E:
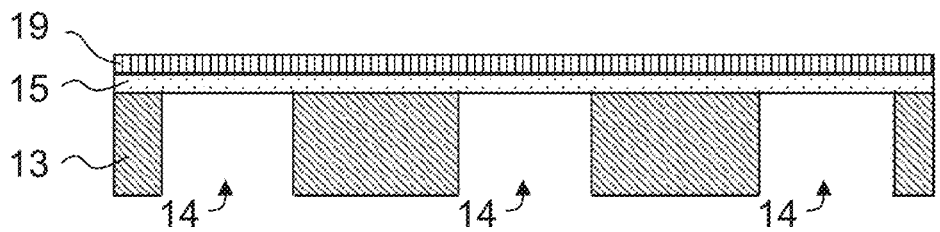
Figure 4F:
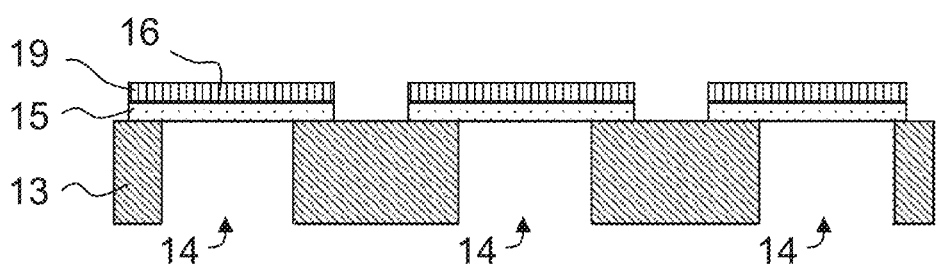

A second example of a method of manufacturing a plurality of optical components according to an embodiment of the present technology is illustrated in FIGS. 4a to 4f. Again, it should be noted that these Figures are not to scale. As in the first example, initially a carrier wafer 13 is provided (FIG. 4a), and a membrane 15 is disposed on the carrier wafer 13 (FIG. 4b). Next, an optics layer 19 is disposed on top of the membrane 15 (FIG. 4c). The optics layer 19 is then structured to form diffractive optical elements (DOEs) in the layer 19. For instance, the diffractive optical elements may be created in the optics layer 19 by nanoimprint lithography or greyscale lithography. Subsequently, the carrier substrate 13 is ground at its bottom surface to reduce the thickness of the carrier substrate 13 (FIG. 4d). Like in the first example, this step is optional and may be carried out earlier (before creation of the optical elements) or later (after etching the cavities). The cavities 14 are then etched, and parts of the membrane 15 that are laterally outside of the membrane-spanning portion are selectively removed (FIG. 4O.

Selective removal of parts of the membrane 15 is more easily possible in this second example than in the first example, since the optics layer 19 can be composed of a material that can readily be etched, whereas the polymer base layer 18 may be more difficult to remove. It is readily possible to stack two or more of the "monolithic optical spacer wafers" that result from the method of the second example, since the upper surface of the "monolithic optical spacer wafers" can readily be manufactured so as to be free of polymers.

The structures on top of the carrier substrate 13 that result from the method of the second example may be much thinner than the structures that result from the first example. In particular, the structured optics layer 19 may be as thin as 1 µm, whereas a typical thickness of the base layer 18 may be up to 100 µm. The reduced thickness is advantageous in that it further reduces the possibilities of stray light to enter or leave the optical component through the side wall of the structures on top of the carrier substrate 13.

Stacking of "Monolithic Optical Spacer Wafers"

Figure 5A:
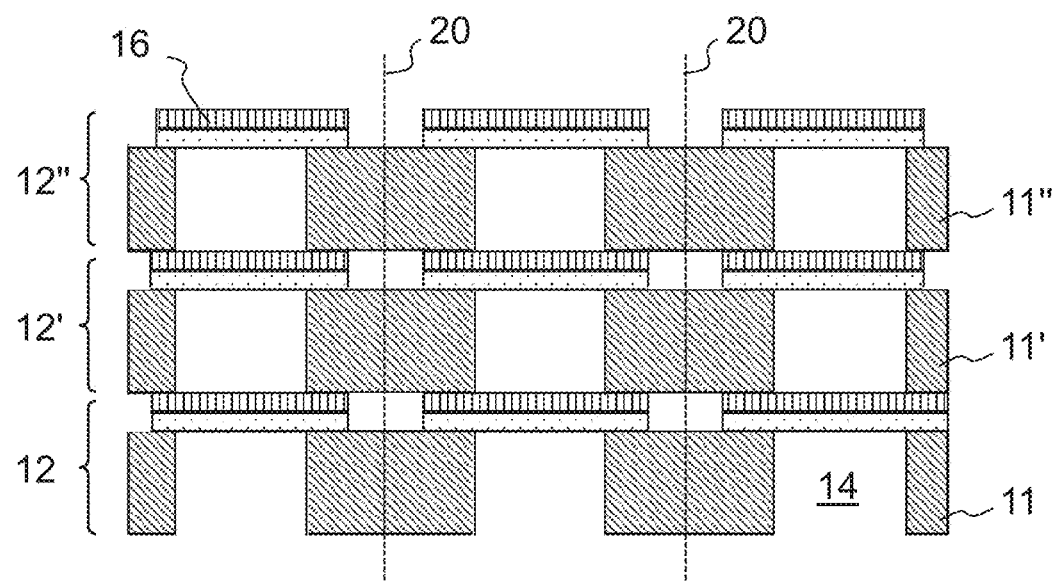
FIG. 5a illustrates the stacking of a plurality of optical components according to an embodiment.

As illustrated in FIG. 5a, two or more of the "monolithic optical spacer wafers" 12, 12', 12" may be stacked such that the cavities of the stacked wafers 12, 12', 12" are mutually aligned. After dicing, this results in a plurality of optical assemblies, each optical assembly comprising two or more optical components 11, 11', 11" that are stacked in such a manner that the cavities 14 of the optical components 11, 11', 11" are mutually aligned, e.g., the upper end of the cavity 14 of the respective lower optical component 12 faces the lower end of the cavity of the respective upper optical component 12'.

The optical components 11, 11', 11" in each optical assembly may have the same or different heights and may comprise the same types of optical element 16 or different types of optical elements 16. For instance, the optical elements 16 in each optical assembly may comprise different optical elements that together act as a composite lens with reduced aberrations. Such optical assemblies may be particularly useful in imaging applications.

Figure 5B:
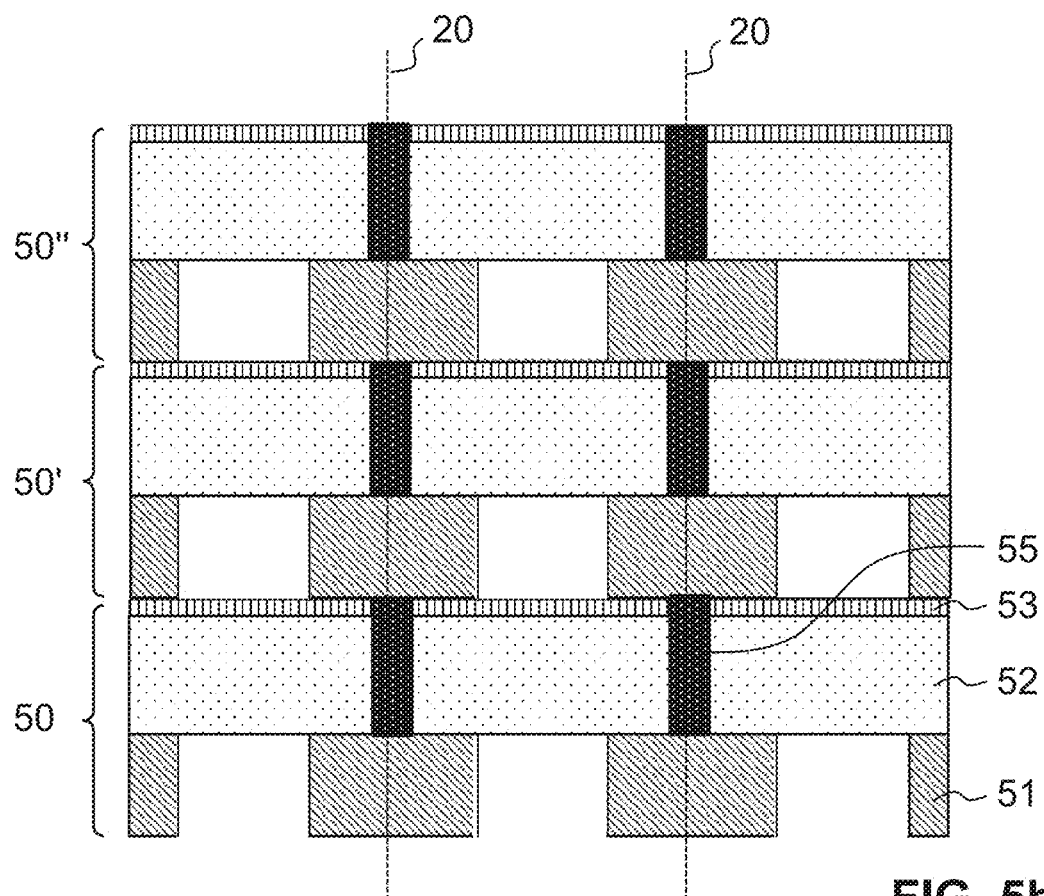
FIG. 5b illustrates the stacking of a plurality of optical components according to an embodiment.

An optical assembly that results from stacking optical components according to the present technology may have reduced height as compared to an optical assembly that results from stacking optical components in other designs. This is illustrated in FIG. 5b, where a stack of spacer/optics structures 50, 50', 50" constructed according to the principles of US2015325613A1 is schematically shown. Each spacer/optics structure comprises a carrier substrate 51, a transparent wafer 52, and an optics layer 53 on top of the transparent wafer 52. In order to avoid light leakage, trenches 55 filled with an opaque material have been provided as light-blocking elements. As the transparent wafer 52 of this embodiment is a separate wafer, having a relatively large required minimum thickness, the resulting optical assembly is much higher than in FIG. 5a.

Considerations as to the Width of the Lateral Perimeter Wall

Depending on the material of the carrier substrate 13 and the wavelength range of light that is to be emitted or received by the optoelectronic module, the lateral perimeter wall that laterally delimits the cavity 14 should preferably have certain minimum required lateral width d (e.g., thickness measured in a direction perpendicular to the height direction, see FIG. 2b) to avoid excessive light leakage through the perimeter wall.

Figure 6:
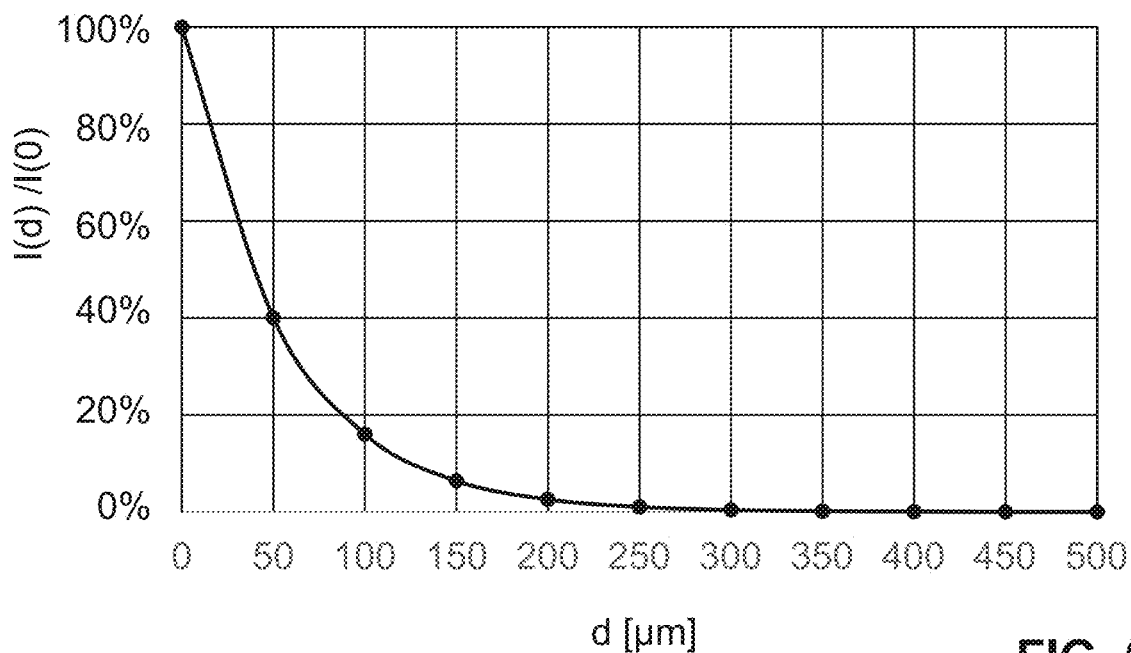
FIG. 6 illustrates a diagram that illustrates the attenuation of light at wavelength 940 nm in silicon.

FIG. 6 illustrates the attenuation of light at a wavelength of 940 nm, as it may be emitted from a vertical cavity surface emitting laser (VCSEL), in pure silicon. The linear attenuation coefficient of the light is of 183 $cm^{-1}$. After a traveled distance of 250 µm, the light has been attenuated to less than 1% of its intensity. If this intensity level is acceptable, the required minimum width of the lateral perimeter wall is therefore 250 µm. Light leakage can be further reduced by using silicon having lesser quality, e.g., having a higher density of impurities or defects. In this manner, the lateral perimeter wall can be made thinner. In practice, a reasonable minimum width of the lateral perimeter wall may be about 100 µm for stability reasons. Preferably, the width is at least 200 µm.

On the other hand, it is undesirable to make the lateral perimeter wall thicker than necessary, e.g., thicker than about 500 µm, because this would render the optical component unnecessarily bulky and would increase production costs.

Further Reduction of Light Leakage

Figure 7:
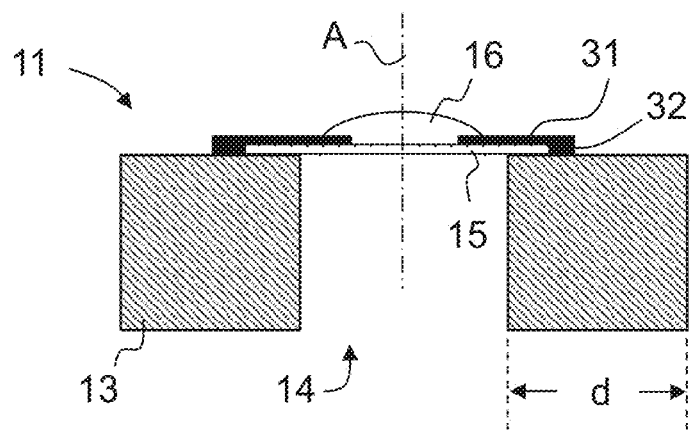
FIGS. 7-16 illustrate optical components in accordance with embodiments.

If light leakage through the lateral side wall of the membrane 15 is still too high, it is possible to provide an opaque layer that laterally covers a perimeter of the membrane to prevent light from entering or exiting the membrane at its perimeter. This is illustrated in FIG. 7. Here, a structured metal layer has been selectively applied along the perimeter of the membrane, e.g., by physical vapor deposition (PVD), the metal layer forming an opaque layer 32 around the perimeter of the membrane.

Light Baffle with Aperture

As also illustrated in FIG. 7, an opaque baffle or diaphragm 31 may be present on the cavity-spanning portion of the membrane 15, the baffle 31 having an opening that defines an aperture for the light that enters or exits the cavity 14 through the cavity-spanning portion of the membrane 15 along an optical axis A. The baffle may be formed by the same metal layer that also covers the perimeter of the membrane, or it may be formed independently of any such layer.

Figure 8:
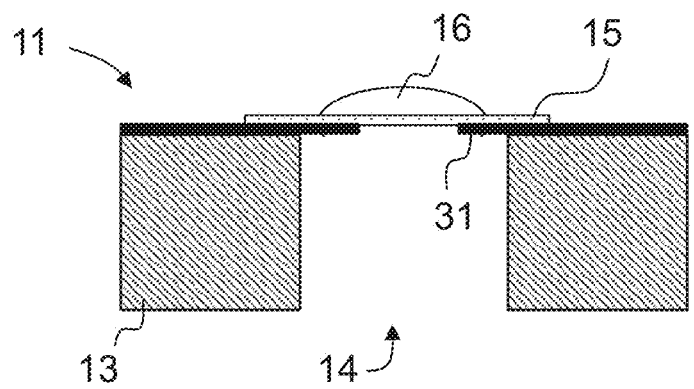

As illustrated in FIG. 8, an opaque baffle 31 may instead or additionally also be present on the bottom of the cavity-spanning portion of the membrane. Such a baffle may be produced, e.g., by providing a structured metal layer on the carrier substrate 13 before the transparent layer(s) of the membrane 15 are applied.

A baffle may also be formed between two transparent membrane layers.

Diffractive Optical Element on Membrane

Figure 9:
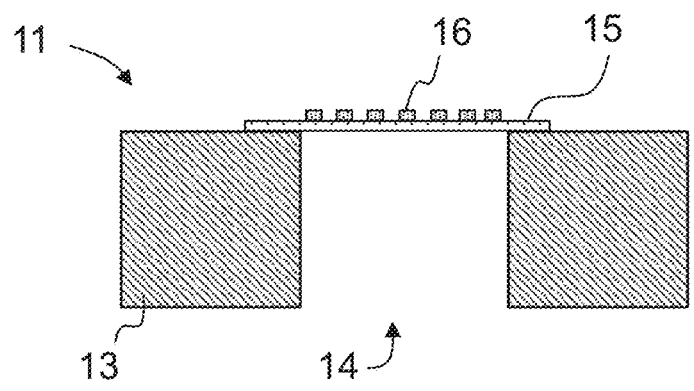

As illustrated in FIG. 9, the optical element 16 may be a diffractive optical element (DOE). As explained above, such an element may be produced, e.g., by nanoimprint lithography or greyscale lithography.

Optical Element on Bottom Surface of Membrane

Figure 10:
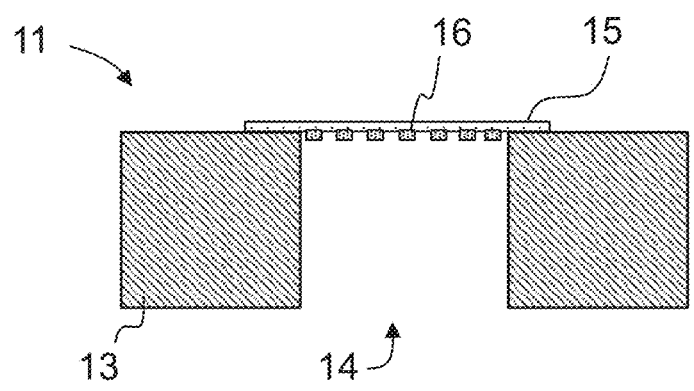

As illustrated in FIG. 10, it is not only possible to dispose an optical element 16 on the upper surface of the membrane 15, which faces away from the cavity, but it is also possible to dispose the optical element 16 on the bottom surface of the membrane, which faces the cavity, in a wafer-level process after the cavity 14 has been etched. While this may be easier to achieve for a diffractive optical element 16, as in FIG. 10, this is as well possible for a refractive optical element (ROE) like the polymer lenses of the embodiment of FIGS. 7 and 8.

Optical Element Inside Membrane

Figure 11:
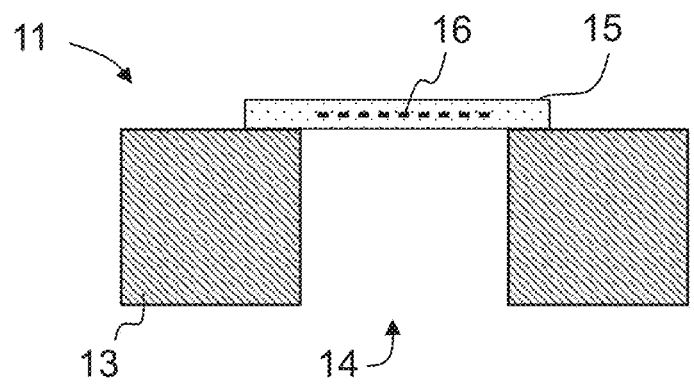

It is also possible to create a diffractive structure acting as an optical element 16 within the membrane 15, as illustrated in FIG. 11. This may be done, e.g., by creating a membrane comprising two transparent layers with a structured metal layer in between, the structured metal layer defining a diffractive structure.

Diffusor

Figure 12:
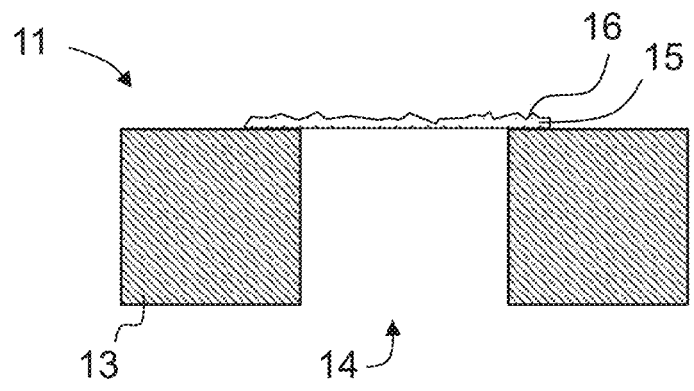

As illustrated in FIG. 12, the optical element 16 may also be created by structuring a surface of the membrane itself. In the example of FIG. 12, an irregular, "rough" structure is caused in the upper surface of the membrane 15 to create an optical element 16 that acts as a diffusor.

As an alternative, a separate diffusor layer may be applied to the upper or lower surface of the membrane. The diffusor layer may be a structured layer of a material that has a different index of refraction than the membrane material, or it may be a polymer layer with embedded particles for scattering light that enters the polymer layer.

In addition, or in the alternative, the surface roughness of the membrane surface facing the cavity may be increased by tuning the etch process parameters, such that is effectively acts as an optical diffusor.

Preventing the Membrane from Acting as a Light Guide

Figure 13:
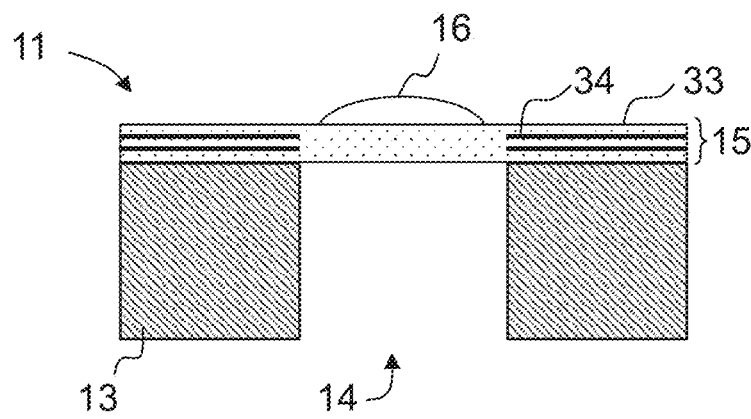
Figure 14:
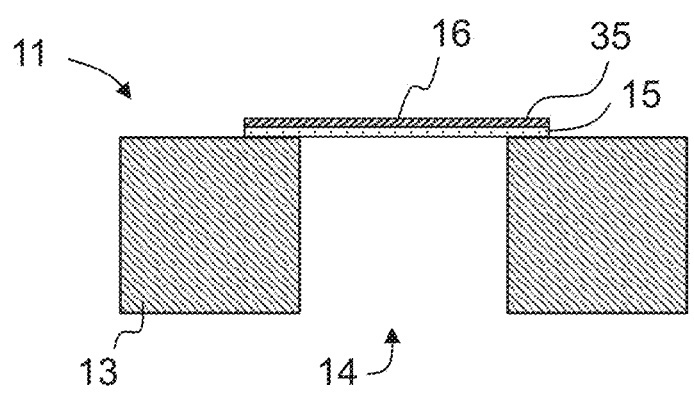

If the membrane has a thickness that exceeds the wavelength of the light, the membrane can act as a light guide, whereby light leakage through the lateral side wall of the membrane would be increased. To prevent this from happening, the membrane, at least in a region that laterally surrounds the cavity-spanning portion, may comprise a layer stack comprising a plurality of transparent layers separated by opaque metal layers. The thickness of each transparent layer may then be chosen to be smaller than a wavelength of the light for which the transparent layer is transparent. In this manner, light cannot propagate laterally in the transparent layers, this avoiding that the membrane acts as a light guide. This is illustrated in FIG. 13 (transparent layers 33, metal layers 34).

Such a structure may be produced by depositing a transparent layer 33 on the wafer that forms the carrier substrate 13, then creating an appropriately structured metal layer 34 on top of the transparent layer 33 and repeating this as often as necessary to obtain a membrane having a desired thickness.

Considerations as to Sequence of Layers

In case of a multi-layer membrane, it is preferred that the layer sequence of the cavity-spanning portion of the membrane is chosen in such a manner that the index of refraction monotonically increases along the direction of travel of the light in order to minimize reflection at the membrane. For instance, if a silicon nitride layer (index of refraction≈2.01 at 940 nm) and a silicon oxide layer (index of refraction≈1.45 at 940 nm) are present, it is preferred that the silicon nitride layer is applied on the lower surface of the membrane if the optical component is to be used together with a light source in the cavity, or on the upper surface of the membrane if the optical component is to be used together with a light detector in the cavity.

Dielectric Filter

Figure 15:
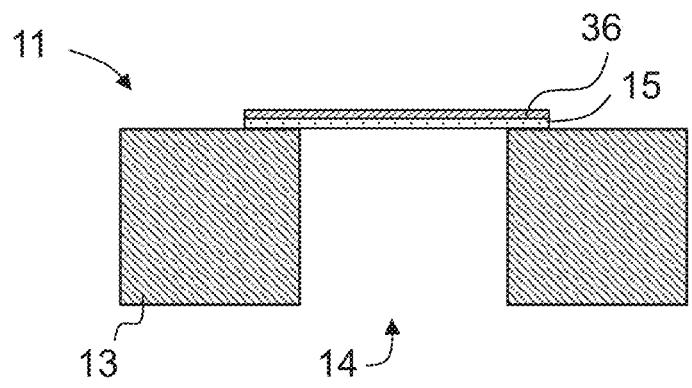

A dielectric filter configured to selectively transmit or reject light in at least one predetermined wavelength range (e.g., an optical highpass, lowpass or bandpass filter) may be deposited on the membrane of the "monolithic optical spacer wafer" by depositing layers of materials with different indices of refraction (e.g., $TiO_2/SiO_2$, $TiO_2/MgF_2$) onto the membrane. Such dielectric filters are known in the art per se. This is schematically illustrated in FIG. 15 (dielectric filter 36).

The dielectric filter may be combined with one or more optical elements for shaping or diffusing the light as described above.

The Membrane

The surface quality of the membrane on the "monolithic optical spacer wafer" can determine how well light can enter and leave the membrane. The upper surface of the membrane, which faces away from the cavity, is normally not critical, since wafer deposition of the membrane materials (e.g., SiO by PECVD) typically results in very high surface quality. However, the bottom surface of the membrane, which faces the cavity, has a surface determined by the etching process with which the cavity has been created. The resulting surface quality may be difficult to control.

For increasing the quality of the bottom membrane surface, an etch stop layer (e.g., a metal layer) may be deposited on the upper surface of the carrier substrate before the layers that are to form the cavity-spanning portion of the membrane are deposited on top of the etch stop layer. The etching process may then be carried out as follows: In a first step, the carrier substrate is etched only up to the etch stop layer. In the second step, the etch stop layer is then selectively etched away to expose the cavity-spanning portion of the membrane. In the second step, a much more controlled etching process may be employed than in the first step (e.g., wet etching in the second step vs. DRIE in the first step). Accordingly, a better surface quality of the bottom membrane surface may result.

Figure 16:
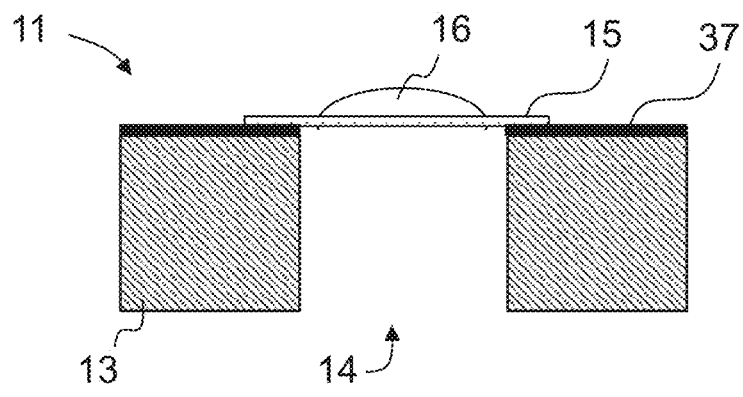

A corresponding optical component is shown in FIG. 16 (etch stop layer 37, not to scale).

Silicon-On-Insulator Substrate

Manufacture of the optoelectronic component may be simplified and may be made more cost-efficient by employing a silicon-on-insulator (SOI) wafer. An SOI wafer comprises a carrier substrate) composed of silicon, an insulating layer (e.g., silicon oxide or silicon nitride) on top of the carrier substrate, and a thin silicon layer on top of the insulating layer.

Such wafers are commercially available.

The membrane may then comprise the silicon layer, and the insulating layer may be used as an etch stop layer when the cavities are created. While silicon absorbs light in most wavelength ranges of interest, attenuation of the light may be kept in a tolerable range by employing a sufficiently thin membrane. For instance, at a wavelength of 940 nm, pure silicon has an attenuation coefficient of 183 $cm^{-1}$, and attenuation of light through a silicon membrane having a thickness of 1-2 µm is in the range of 1.8%-3.5%, which may still be tolerable in many applications. An added advantage of silicon as a membrane material is that light is unable to travel through the membrane laterally, as it gets quickly absorbed in the membrane material.

Since silicon has a rather high index of refraction, the insulating layer may form part of the cavity-spanning portion of the membrane, acting as an anti-reflective coating in applications where a light source is to be disposed in the cavity. In other applications, the insulating layer may be used as an initial etch stop and may subsequently be etched away using a selective etching process to obtain a silicon membrane with very high surface quality on the bottom surface that faces the cavity.

Optoelectronic Module

Figure 17:
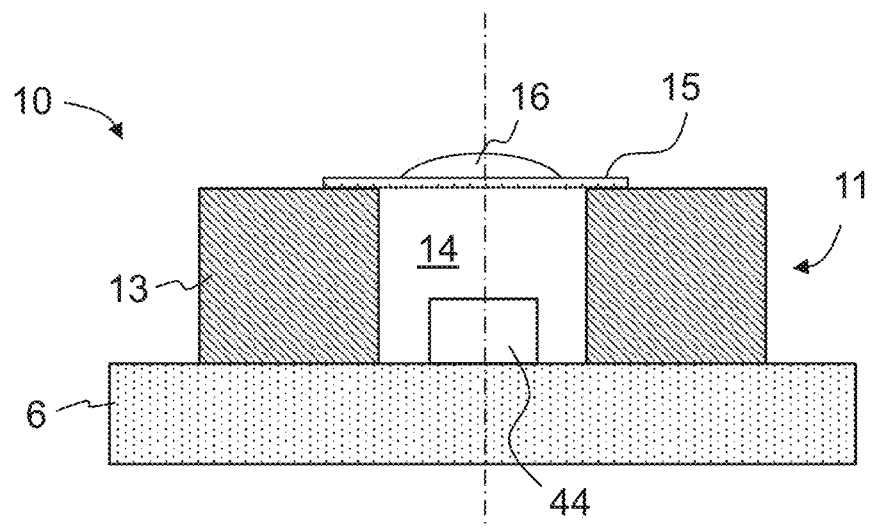
FIGS. 17 and 18 illustrate examples of optoelectronic modules comprising an optical component according to an embodiment.

FIG. 17 illustrates a complete optoelectronic module 10 that includes an optical component 11 according to an embodiment of the present technology. The optoelectronic module 10 comprises a base substrate 6, e.g., in the form of a printed circuit board (PCB) or a land grid array (LGA). An optoelectronic device 44 for emitting or detecting light is disposed on the base substrate 6. The optoelectronic device may be a light source or a light detector. For instance, the optoelectronic device may be a light-emitting diode (LED) or a laser, more specifically, an infrared LED, an organic LED, an infrared laser, or a vertical cavity surface emitting laser (VCSEL). In other embodiments, the optoelectronic device may be a photodiode, a CCD image sensor, or a CMOS image sensor. Many other types of light sources and light detectors may be employed. More than one optoelectronic device may be present in the optoelectronic module. The optoelectronic module 10 further comprises the optical component 11 with carrier substrate 13, cavity 14, membrane 15 and optical element 16. The optical component 11 is arranged in such a manner that the optoelectronic device 44 faces the optical element 16 through the cavity 14, so as to be able to emit light towards the optical element 16 or to receive light from the optical element 16. In the present example, the optical component 11 is mounted directly on the base substrate 6, such that the optoelectronic device is received in the cavity 14 at the lower end of the cavity 14.

Figure 18:
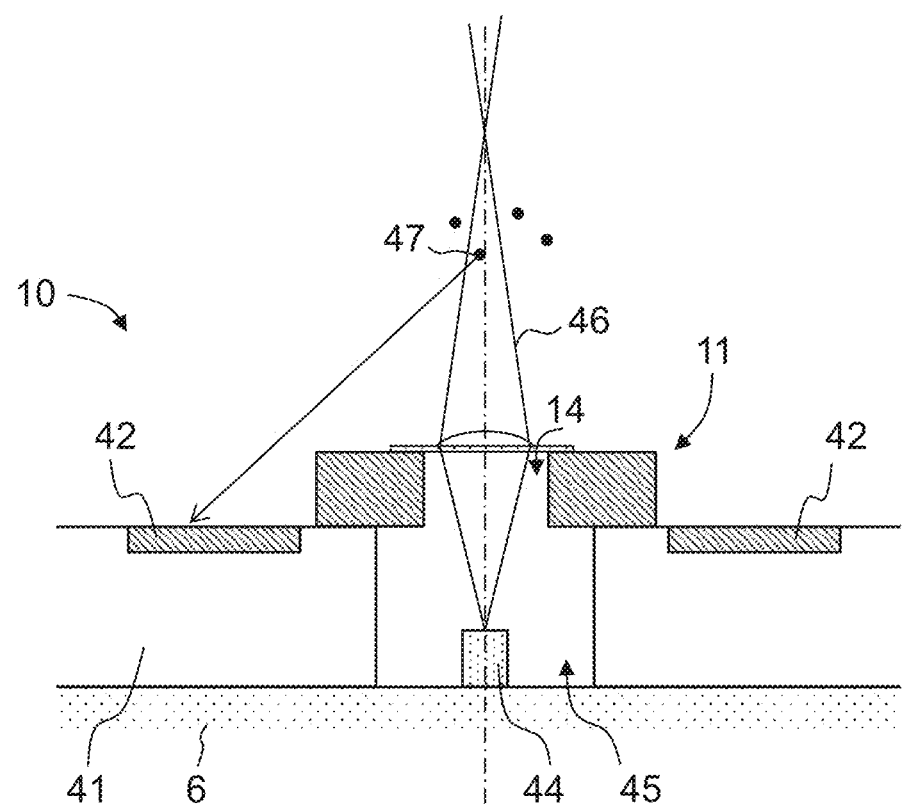

It is also conceivable that one or more additional elements are disposed between the base substrate 6 and the optical component 11. This is illustrated in FIG. 18, which shows an embodiment of an optoelectronic module 10 that is configured as a particulate matter (PM) sensor that works according to the principles disclosed in WO2021213692A1. As in the embodiment of FIG. 17, the optoelectronic module 10 comprises a base substrate 6. An optoelectronic device in the form of a light source 44 is mounted on the base substrate 6. A detector chip 41 is also provided on the base substrate 6. The detector chip 41 has a detector chip cavity 45. At least one photodetector 42 is integrated into an upper surface of the detector chip 41. The optical component 11 is arranged on the upper surface of the detector chip 41 in such a manner that the cavity 14 of the optical component 11 is aligned with the detector chip cavity 45. The detector chip 41 is arranged relative to the light source 44 in such a manner that light emitted from the light source 44 is able to reach the optical element 16 of the optical component 11 through the detector chip cavity 45 and the cavity 14 of the optical component 11. In the present example, the detector chip 41 is mounted directly on the base substrate 6. However, it is conceivable that one or more further elements are disposed between the base substrate 6 and the detector chip 41, e.g., a spacer element.

In operation of the PM sensor, the light source 44 emits a light beam 46. The optical component 11 shapes the light beam 46 to define a detection volume for particulate matter outside the optoelectronic module 10. When a PM particle 47 traverses the detection volume, light is scattered by the particle and is detected by the photodetector 42.

While in these embodiments, the optoelectronic module 10 comprises a single optical component 11, the optoelectronic module may as well comprise an assembly of two or more such optical components stacked on top of each other. Each of these optical components may comprise the same type of optical element 16 or a different type of optical element 16.

Operations of processes described herein can be performed in any suitable order unless otherwise indicated herein or otherwise clearly contradicted by context.

Accordingly, in at least one embodiment, computer systems are configured to implement one or more services that singly or collectively perform operations of processes described herein and such computer systems are configured with applicable hardware and/or software that enable performance of operations. Further, a computer system that implements at least one embodiment of present disclosure is a single device and, in another embodiment, is a distributed computer system comprising multiple devices that operate differently such that distributed computer system performs operations described herein and such that a single device does not perform all operations.

Use of any and all examples, or exemplary language (e.g., "such as") provided herein, is intended merely to better illuminate embodiments of disclosure, and does not pose a limitation on scope of disclosure unless otherwise claimed. No language in specification should be construed as indicating any non-claimed element as essential to practice of disclosure.

The invention claimed is:

1. An optical component comprising:
a chip comprising a carrier substrate including a semiconductor material and a membrane directly disposed on an exterior planar membrane-carrying surface of the carrier substrate, the membrane formed integrally with the carrier substrate;
a cavity formed in the carrier substrate, the cavity including a first end and a second end, the membrane including a cavity-spanning portion that spans the cavity at its first end, the cavity-spanning portion of the membrane being transparent to light in a wavelength range of interest; and
at least one optical element formed on or in the cavity-spanning portion of the membrane, the at least one optical element to modify light,
wherein the optical component is only a passive component and does not include any complementary metal oxide semiconductor (CMOS) circuitry, and
wherein a height of the membrane is less than ten percent a height of the carrier substrate.

2. The optical component of claim 1,
wherein the planar membrane-carrying surface of the carrier substrate is laterally delimited by a perimeter,
wherein the membrane comprises at least one transparent membrane layer, and
wherein the at least one transparent membrane layer only partially laterally extends on the perimeter of the planar membrane-carrying surface of the carrier substrate, leaving a strip on the membrane-carrying surface along the perimeter of the at least one transparent membrane layer that lacks any transparent membrane material.

3. The optical component of claim 1,
wherein the membrane comprises at least one transparent membrane layer, and
wherein the optical component comprises an opaque layer that laterally covers a perimeter of the at least one transparent membrane layer to prevent light from entering or exiting the membrane at its perimeter.

4. The optical component of claim 3, wherein the opaque layer includes a metal layer.

5. The optical component of claim 1,
wherein the membrane, at least in a region that laterally surrounds the cavity-spanning portion, comprises a layer stack comprising a plurality of transparent membrane layers separated by metal layers, and
wherein each of the transparent membrane layers has a thickness that is smaller than a wavelength of light for which the respective transparent membrane layer is transparent.

6. The optical component of claim 1, wherein the carrier substrate forms a lateral perimeter wall that laterally delimits the cavity, the lateral perimeter wall having a lateral width of no more than 500 micrometers.

7. The optical component of claim 1, wherein the carrier substrate is made of silicon.

8. The optical component of claim 1, wherein the membrane comprises at least one membrane layer including a material selected from silicon oxide, silicon nitride, crystalline silicon, and amorphous silicon.

9. The optical component of claim 1,
wherein the chip is a silicon-on-insulator chip comprising the carrier substrate, the carrier substrate composed of silicon, an insulating layer on top of the carrier substrate and a silicon layer on top of the insulating layer, and
wherein the cavity-spanning portion of the membrane comprises the silicon layer.

10. The optical component of claim 9, wherein the cavity extends through the carrier substrate and the insulating layer all the way to the silicon layer, such that the cavity-spanning portion of the membrane comprises the silicon layer but not the insulating layer.

11. The optical component of claim 9, wherein the cavity extends through the carrier substrate up to the insulating layer such that the cavity-spanning portion of the membrane comprises both the silicon layer and the insulating layer.

12. The optical component of claim 1, wherein the at least one optical element comprises an external optical element disposed on a surface of the cavity-spanning portion of the membrane that faces away from the cavity and/or on a surface of the cavity-spanning portion of the membrane that faces towards the cavity.

13. The optical component of claim 1, wherein the at least one optical element comprises an internal optical element formed inside the cavity-spanning portion of the membrane, the internal optical element embedded within the membrane.

14. The optical component of claim 1, wherein the at least one optical element comprises a surface structure formed in a surface of the cavity-spanning portion of the membrane that faces away from the cavity and/or in a surface of the cavity-spanning portion of the membrane that faces towards the cavity.

15. The optical component of claim 1, wherein the at least one optical element comprises a focal element configured to concentrate light that impinges on the at least one optical element.

16. The optical component of claim 1, wherein the at least one optical element comprises a diffusor configured to diffuse light that impinges on the at least one optical element.

17. The optical component of claim 1, wherein the at least one optical element comprises a dielectric filter configured to selectively transmit or reject light in at least one predetermined wavelength range.

18. The optical component of claim 1, wherein the at least one optical element comprises an opaque baffle having an opening that defines an aperture for light that enters or exits the cavity through the cavity-spanning portion of the membrane.

19. The optical component of claim 1,
wherein the carrier substrate has a constant or maximum carrier substrate thickness,
wherein the cavity-spanning portion of the membrane has a constant or maximum membrane thickness, and
wherein the constant or maximum membrane thickness is 10% or less of the constant or maximum carrier substrate thickness.

20. The optical component of claim 1, wherein the cavity-spanning portion of the membrane has a thickness that is at most 20 micrometers.

21. The optical component of claim 1, wherein the membrane is configured to be an etch stop to prevent further etching.

22. The optical component of claim 1, wherein an upper surface of the membrane was formed by wafer deposition and a lower surface of the membrane was formed by etching, and wherein the upper surface is opposite of the lower surface.

23. The optical component of claim 1, wherein a height of the membrane is between one to ten percent a height of the carrier substrate.

24. The optical component of claim 1, wherein the optical element is on a surface of the membrane, wherein the surface is opposite another surface of the membrane.

25. The optical component of claim 1, wherein the cavity was monolithically formed in the carrier substrate.

26. The optical component of claim 1, wherein the wavelength range of interest includes between 400 nm to 1100 nm.

27. The optical component of claim 1, wherein a height of the membrane is less than one percent a height of the carrier substrate.

28. The optical component of claim 1, the optical element is integrated into a surface of the membrane and a portion of the optical element extends away from the surface.

29. The optical component of claim 1, wherein the carrier substrate includes a thickness in one dimension between 200 μm and 500 μm.

30. The optical component of claim 1, wherein the membrane includes a thickness in one dimension of less than 2 μm.

31. An optical component comprising:
a chip comprising a carrier substrate including a semiconductor material and a membrane disposed directly on an exterior planar membrane-carrying surface of the carrier substrate, the membrane formed integrally with the carrier substrate;
a cavity formed in the carrier substrate, the cavity including a first end and a second end, the membrane including a cavity-spanning portion that spans the cavity at its first end, the cavity-spanning portion of the membrane being transparent to light in a wavelength range of interest; and
at least one optical element formed on or in the cavity-spanning portion of the membrane, the at least one optical element to modify light,
wherein the optical component is only a passive component and does not include any complementary metal oxide semiconductor (CMOS) circuitry, and
wherein a height of the membrane is at most 10 micrometers.

32. The optical component of claim 31, wherein the carrier substrate comprises at least one of Group III, IV, or V semiconductor material.

33. The optical component of claim 31, wherein the at least one optical element includes a convex surface that extends away from an exterior surface of the membrane.

* * * * *